(12) United States Patent
Kato et al.

(10) Patent No.: US 9,536,121 B2
(45) Date of Patent: Jan. 3, 2017

(54) SEMICONDUCTOR DEVICE AND CHIP IDENTIFIER SETTING METHOD

(71) Applicant: CANON KABUSHIKI KAISHA, Tokyo (JP)

(72) Inventors: Yasuhiro Kato, Tokyo (JP); Wataru Ochiai, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 61 days.

(21) Appl. No.: 14/297,126

(22) Filed: Jun. 5, 2014

(65) Prior Publication Data

US 2014/0368319 A1    Dec. 18, 2014

(30) Foreign Application Priority Data

Jun. 14, 2013  (JP) ................. 2013-126128

(51) Int. Cl.
*H04Q 5/22* (2006.01)
*G06K 7/10* (2006.01)
*G11C 8/12* (2006.01)
*H01L 25/065* (2006.01)
*H01L 23/00* (2006.01)

(52) U.S. Cl.
CPC ............. *G06K 7/10366* (2013.01); *G11C 8/12* (2013.01); *H01L 24/16* (2013.01); *H01L 25/0657* (2013.01); *H01L 2224/16145* (2013.01); *H01L 2224/16225* (2013.01); *H01L 2225/06513* (2013.01); *H01L 2225/06517* (2013.01); *H01L 2225/06565* (2013.01)

(58) Field of Classification Search
CPC ............. G06K 7/10366; G06K 7/0008; G06K 19/0723; G06K 19/07749; H01L 23/5384

USPC .............. 340/10.1, 10.3, 10.32, 10.4, 12.51, 3.51,340/3.54; 361/760, 762, 767, 783; 257/773, 257/774, 777

See application file for complete search history.

(56) References Cited

U.S. PATENT DOCUMENTS

| | | | |
|---|---|---|---|
| 2008/0150692 A1* | 6/2008 | Missimer ........... | G06K 7/10039 340/10.1 |
| 2009/0040026 A1* | 2/2009 | Tanaka ................. | G08B 25/003 340/10.1 |
| 2009/0315686 A1* | 12/2009 | Oberle .................... | G06F 21/35 340/10.52 |
| 2010/0155921 A1* | 6/2010 | Saen ....................... | G11C 5/02 257/686 |

(Continued)

FOREIGN PATENT DOCUMENTS

JP        4799157 B        8/2011
JP        2011-258266 A    12/2011

*Primary Examiner* — Kerri McNally
*Assistant Examiner* — Anthony D Afrifa-Kyei
(74) *Attorney, Agent, or Firm* — Carter, DeLuca, Farrell & Schmidt, LLP

(57) ABSTRACT

A semiconductor chip transmits a request signal which requests notification of the setting state of a chip identifier to another semiconductor chip connected to one of the upstream and downstream, receives a response signal indicating the setting state of the chip identifier and the value of the chip identifier, as a response to the request signal, and performs a chip identifier setting process based on the response signal. When receiving a request signal from another semiconductor chip connected to the other of the upstream and downstream, the semiconductor chip transmits a response signal indicating the setting state of the chip identifier and the value of the chip identifier, as a response to the request signal.

16 Claims, 6 Drawing Sheets

(56) References Cited

U.S. PATENT DOCUMENTS

2012/0066432 A1* 3/2012 Miura ................... G06F 13/161
                                                      711/102
2013/0054849 A1* 2/2013 Loh ..................... G06F 13/4265
                                                      710/100

* cited by examiner

SEMICONDUCTOR DEVICE AND CHIP IDENTIFIER SETTING METHOD

BACKGROUND OF THE INVENTION

Field of the Invention

The present invention relates to a semiconductor device comprising a plurality of semiconductor chips.

Description of the Related Art

Recently, an increase in leakage current caused by heat generated by a transistor, a signal delay in an interconnection, and the like are becoming problems and limiting further micropatterning of semiconductor exposure processes. As a technique of breaking the limit of micropatterning in a plane, a three-dimensional packaging technique by which semiconductor chips are stacked and interconnected by a through via (vertical interconnect access) extending through the semiconductor chips is attracting attention. Also, a 2.5-dimensional packaging technique by which a plurality of semiconductor chips are arranged parallel on a silicon interposer having undergone the through via technique and are interconnected by a through via is similarly attracting attention.

When a plurality of semiconductor chips are stacked by the three-dimensional packaging technique, these semiconductor chips are electrically connected by a through via extending through the semiconductor chips. That is, the semiconductor chips are connected to a shared bus by the through via, or adjacent semiconductor chips are interconnected by bus connection.

When transferring data to a specific semiconductor chip between the interconnected semiconductor chips, a mechanism for performing selective transfer is necessary. As a method of performing selective transfer, there is a method of giving unique chip identifiers to stacked semiconductor chips. When the chip identifiers of a transmission source and transmission destination are added to data to be transferred, each semiconductor chip can determine whether the data is addressed to it. If the data is addressed to the semiconductor chip, the semiconductor chip processes the data. If the data is not addressed to the semiconductor chip, the semiconductor chip does not process the data or transfers the data to a next semiconductor chip.

As a technique of allocating chip identifiers to semiconductor chips, a technique of storing the chip identifier in an internal memory of each semiconductor chip before the semiconductor chips are stacked is known. Although this technique can allocate a given chip identifier to each semiconductor chip, it becomes necessary to identify the individual semiconductor chips when stacking them, and this decreases the efficiency and increases the cost. That is, it is desirable to allocate chip identifiers to semiconductor chips after they are stacked.

A technique of allocating chip identifiers to semiconductor chips after they are stacked has been proposed. In this technique, a chip identifier of a semiconductor chip is input by using a dedicated line of the chip. A semiconductor chip to which a chip identifier is input increments or decrements the input value, and outputs the incremented or decremented value as a chip identifier of a next semiconductor chip to a dedicated line of the next semiconductor chip. This technique can allocate a unique chip identifier to each semiconductor chip when the power supply is turned on.

Also, there is another technique by which semiconductor chips spread an instruction for fetching a signal value used in normal data transfer as a chip identifier by delaying the instruction. At a timing at which the instruction becomes valid in each semiconductor chip, an arbitrary chip identifier is allocated to the semiconductor chip by controlling the signal value used in normal data transfer.

In the above-mentioned techniques, however, dedicated lines for allocating chip identifiers are necessary, and this increases the number of interconnections. Also, to allocate chip identifiers to semiconductor chips, it is necessary to grasp the delay amount of the instruction for retrieving a signal value as a chip identifier.

SUMMARY OF THE INVENTION

In one aspect, a semiconductor device comprising a plurality of semiconductor chips, each semiconductor chip comprising: a first transmission unit configured to transmit a request signal which requests notification of a setting state of a chip identifier, to a first semiconductor chip connected on one of an upstream and a downstream; a first reception unit configured to receive a response signal indicating a setting state of a chip identifier and a value of the chip identifier, as a response to the transmitted request signal; a setting unit configured to perform a chip identifier setting process based on the received response signal; a second reception unit configured to receive the request signal from a second semiconductor chip connected to another of the upstream and the downstream; and a second transmission unit configured to transmit a response signal indicating a setting state of a chip identifier and a value of the chip identifier, as a response to the received request signal.

According to the aspect, chip identifiers can be set in a plurality of semiconductor chips mounted in a semiconductor device.

Further features of the present invention will become apparent from the following description of exemplary embodiments with reference to the attached drawings.

DESCRIPTION OF THE EMBODIMENTS

A semiconductor device of an embodiment according to the present invention will be explained in detail below with reference to the accompanying drawings.

[Arrangement of Semiconductor Device]

Figure 1:
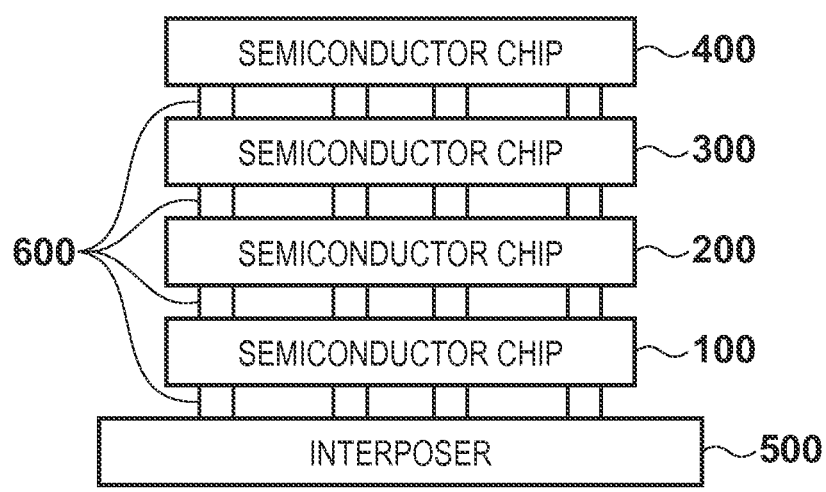
FIG. 1 is a view showing the arrangement of a semiconductor device of an embodiment in which a plurality of semiconductor chips are mounted.

FIG. 1 shows the arrangement of the semiconductor device of the embodiment in which a plurality of semiconductor chips are mounted.

This semiconductor device shown in FIG. 1 includes an interposer substrate 500 in the lowermost layer, and four semiconductor chips are stacked on the substrate 500. A lowermost semiconductor chip 100 is connected to the substrate 500, and three semiconductor chips are stacked in the order of semiconductor chips 200, 300, and 400 on the semiconductor chip 100. Micro bumps 600 as electrodes are formed on the upper and lower surfaces of the semiconductor chips, and adjacent semiconductor chips are electrically connected by connecting the micro bumps 600. The semiconductor chips exchange signals through the micro bumps 600.

Note that in the semiconductor device shown in FIG. 1, the semiconductor chip 100 in the lowermost layer is positioned on the most downstream side of the signal path, and the semiconductor chip 400 in the uppermost layer is positioned on the most upstream side of the signal path. "Lower layer" and "downstream" have the same meaning, and "upper layer" and "upstream" have the same meaning. Also, the arrangement of the semiconductor device of the embodiment is not limited to FIG. 1, and a method of mounting a plurality of semiconductor chips can be either a three-dimensional method or two-dimensional (plane) method. The present invention is widely applicable to semiconductor devices in which a plurality of semiconductor chips are connected by data lines.

To simplify the explanation and indicate the possibility of setting chip identifiers in an arrangement including only identical semiconductor chips, the explanation will be made by assuming that all of the semiconductor chips 100 to 400 have the same function and arrangement and there is no difference between them. However, the present invention is not limited to a device in which all stacked semiconductor chips have the same function and arrangement. That is, the present invention is applicable when semiconductor chips have at least the same chip identifier setting function and the same interface for normal data transfer between the semiconductor chips.

[Arrangement of Semiconductor Chip]

Figure 2:
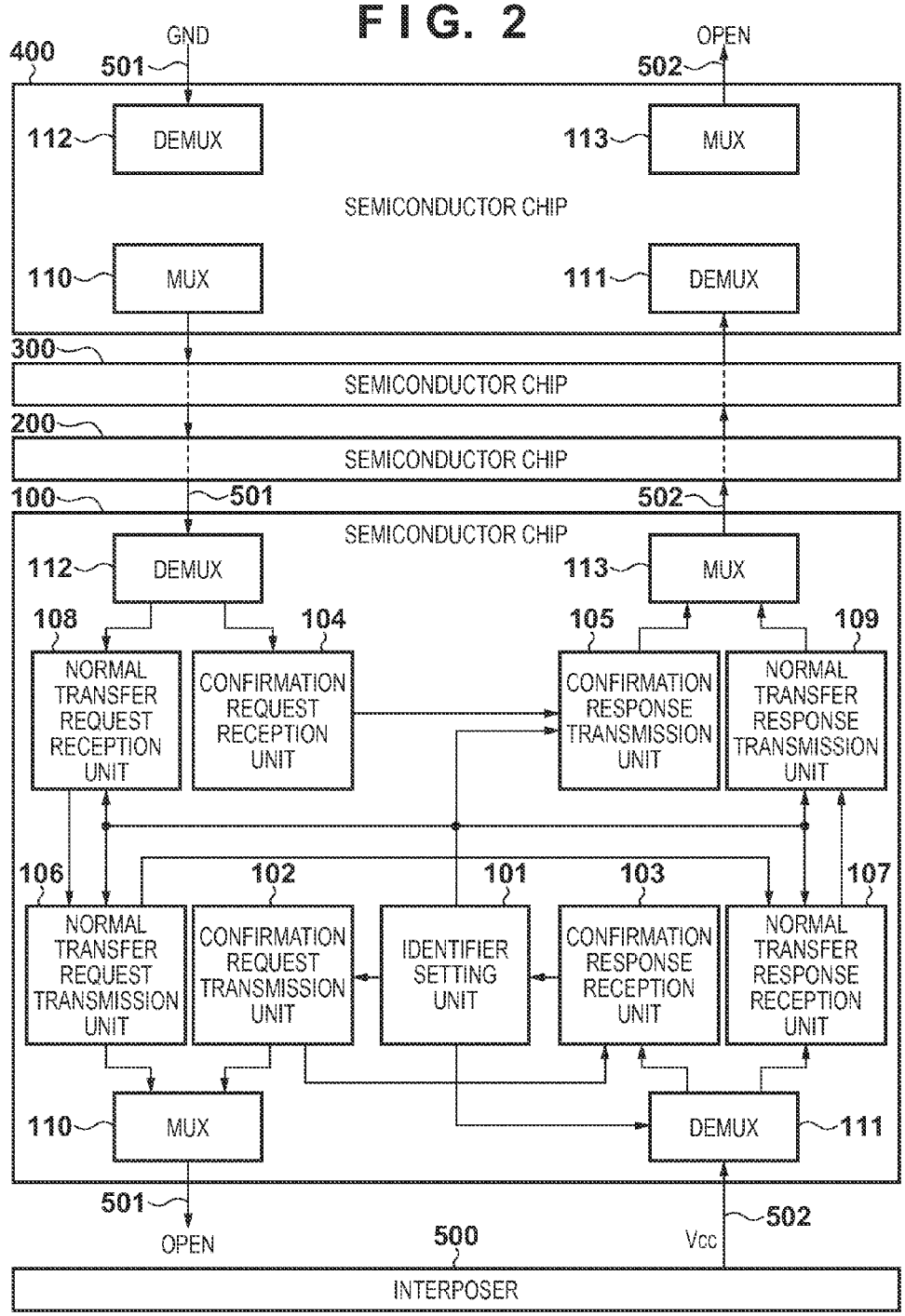
FIG. 2 is a view showing the arrangement of the semiconductor chip.

FIG. 2 shows the arrangement of the semiconductor chips 100 to 400.

The three semiconductor chips are stacked in the order of the semiconductor chips 200, 300, and 400 on the semiconductor chip 100, the interposer substrate 500 exists below the semiconductor chip 100, and a fixed value is input to the semiconductor chip 100 through the substrate 500. Since all of the semiconductor chips 100, 200, 300, and 400 have the same arrangement, FIG. 2 shows the internal arrangement of the semiconductor chip 100 as a representative.

The semiconductor chip 100 includes an identifier setting unit 101 for performing a chip identifier setting process, and a confirmation request transmission unit 102, confirmation response reception unit 103, confirmation request reception unit 104, and confirmation response transmission unit 105 for transmitting or receiving a request signal or response signal. The semiconductor chip 100 also includes a normal transfer request transmission unit 106, normal transfer response reception unit 107, normal transfer request reception unit 108, and normal transfer response transmission unit 109 for performing normal data transfer.

Multiplexers (MUXs) 110 and 113 and demultiplexers (DEMUXs) 111 and 112 transfer a request signal and response signal for a chip identifier setting function and normal data transfer function by sharing the same signal line.

Note that normal data transfer indicates, for example, read access and write access, and is performed through a request bus 501 and response bus 502 formed between the semiconductor chips. The request bus 501 includes, for example, signals such as a control information signal indicating the address and transfer form of a read request, the address and a control information signal of a write request, and write data. The response bus 502 includes, for example, signals such as read data and a control information signal of a read response, and a control information signal of a write response.

The signal of the request bus 501 is input to the upper surface of a semiconductor chip, and output outside from the lower surface of the semiconductor chip. Referring to FIG. 2, the signal of the request bus 501, which is output from the semiconductor chip 400, is input to the semiconductor chip 300, and the signal of the request bus 501, which is output from the semiconductor chip 300, is input to the adjacent semiconductor chip 200. Thus, the request bus 501 is formed to reach the interposer substrate 500.

On the other hand, the signal of the response bus 502 is input to the lower surface of a semiconductor chip, and output outside from the upper surface of the semiconductor chip. Referring to FIG. 2, the signal of the response bus 502, which is output from the interposer substrate 500, is input to the semiconductor chip 100, and the signal of the response bus 502, which is output from the semiconductor chip 100, is input to the adjacent semiconductor chip 200. Thus, the response bus 502 is formed to reach the semiconductor chip 400.

The micro bumps 600 making pairs on the upper and lower surfaces of the semiconductor chips are arranged in the same positions in the plane direction. When the semiconductor chips are stacked, the micro bumps 600 come in contact with and are electrically connected to each other between adjacent semiconductor chips, thereby forming the request bus 501 and response bus 502. In addition, signal lines for normal data transfer in the semiconductor chips are formed by through vias and are connected to the micro bumps 600 outside the semiconductor chips. This enables data transfer inside and outside the semiconductor chips. The form of data transfer between the semiconductor chips can be either a packet system such as serial transfer, or a bus system using a plurality of signal lines. Data transfer will be explained below as the bus system using a plurality of signal lines.

Setting of Chip Identifiers

After reset is canceled, the confirmation request transmission unit 102 of the semiconductor chip 100 transmits an identifier confirmation request to the lower layer. This identifier confirmation request is transmitted outside the semiconductor chip 100 through the MUX 110 and request bus 501. However, the lower layer of the semiconductor chip 100 is the interposer substrate 500, so no semiconductor chip exists, and the request bus 501 is open.

The identifier confirmation request has the same arrangement as that of a read request of a normal data transfer request. That is, the identifier confirmation request is executed by performing a read request for a specific address by using some of the read request signals of the request bus 501. On the other hand, an identifier confirmation response has the same arrangement as that of a read response of a normal data transfer response. That is, the identifier confirmation response is executed by returning a read response containing read data to a received read request by using some of the read response signals of the response bus 502.

The response bus 502 is connected to the semiconductor chip 100 from the direction of the lower layer. However, the response bus 502 connected to the semiconductor chip 100 is fixed at a constant voltage (for example, a power supply voltage Vcc). Therefore, a signal line is fixed in a state in which a response always exists from the direction of the lower layer, and a value indicating the setting completion of a chip identifier and the value of the chip identifier are input.

Note that the setting completion of a chip identifier is indicated by asserting a predetermined bit of read data in a read response as the identifier confirmation response, and a predetermined bit string of the read data indicates the value of the chip identifier.

A transfer response of the response bus 502 is distributed by the DEMUX 111 of the semiconductor chip 100. The DEMUX 111 distributes all transfer responses to the confirmation response reception unit 103 until the setting of the chip identifier of its own chip is completed, and distributes all transfer responses to the normal transfer response reception unit 107 after the setting of the chip identifier is completed. Accordingly, until the setting of the chip identifier of its own chip is completed, the DEMUX 111 distributes the identifier confirmation response to the confirmation response reception unit 103.

When the confirmation request transmission unit 102 transmits the identifier confirmation request, the confirmation response reception unit 103 waits for the identifier confirmation response. In this waiting state, the confirmation response reception unit 103 processes only the identifier confirmation response. When it is confirmed that the received identifier confirmation response indicates the setting completion of the chip identifier, the confirmation response reception unit 103 outputs a setting instruction for setting the setting state of the chip identifier to "complete" to the identifier setting unit 101, and transfers the value of the chip identifier in the identifier confirmation response to the identifier setting unit 101 at the same time.

The identifier setting unit 101 having received the setting instruction sets the setting state of the chip identifier of its own chip to "complete", and generates and holds the chip identifier of its own chip based on the value of the chip identifier transferred from the confirmation response reception unit 103. As the chip identifier of its own chip, the identifier setting unit 101 generates, for example, a value by incrementing (adding 1 to) the value of the chip identifier transferred from the confirmation response reception unit 103. For example, when "0" is received as the value of the chip identifier from the lower layer, the chip identifier of the semiconductor chip 100 becomes "1". The setting of the chip identifier of the semiconductor chip 100 is completed as described above.

Note that the chip identifier generation method is not limited to incrementation, and can be any method as long as a unique chip identifier can be allocated to each semiconductor chip.

Simultaneously with the above-mentioned operation of the semiconductor chip 100, the confirmation request transmission unit 102 of the semiconductor chip 200 transmits an identifier confirmation request to the lower layer. This identifier confirmation request is received by the semiconductor chip 100, and distributed to the confirmation request reception unit 104 by the DEMUX 112 of the semiconductor chip 100. Note that when receiving a read request for a specific address, the DEMUX 112 determines that the identifier confirmation request is received.

In the semiconductor chip 100, the confirmation request reception unit 104 having received the identifier confirmation request outputs an identifier confirmation response transmission instruction to the confirmation response transmission unit 105. The confirmation response transmission unit 105 having received this transmission instruction generates an identifier confirmation response. In this step, the confirmation response transmission unit 105 confirms the setting state and chip identifier of the identifier setting unit 101. If the setting state of the chip identifier is "incomplete", an identifier confirmation response in which a predetermined bit of read data in a read response is deasserted is transmitted to the response bus 502. Also, if the setting state of the chip identifier is "complete", the predetermined bit of the read data is asserted, and an identifier confirmation response representing the chip identifier set in the identifier setting unit 101 by a predetermined bit string of the same read data is transmitted to the response bus 502.

If the identifier confirmation response received by the confirmation response reception unit 103 indicates the setting incompletion of the chip identifier, the identifier setting unit 101 of the semiconductor chip 200 holds the setting state of the chip identifier of its own chip in "incomplete", and outputs an identifier confirmation request retransmission instruction to the confirmation request transmission unit 102. The confirmation request transmission unit 102 having received this retransmission instruction retransmits the identifier confirmation request. Also, if the identifier confirmation response received by the confirmation response reception unit 103 indicates the setting completion of the chip identifier, the identifier setting unit 101 sets the setting state of the chip identifier of its own chip to "complete". Then, based on the value of the chip identifier transferred from the confirmation response reception unit 103, the identifier setting unit 101 generates and holds a chip identifier of its own chip. The setting of the chip identifier of the semiconductor chip 200 is completed as described above.

The semiconductor chips 100, 200, 300, and 400 perform the above operation almost simultaneously, and "1", "2", "3", and "4", for example, are set as the chip identifiers in order from the lowermost semiconductor chip.

After the setting of the chip identifiers is completed, each semiconductor chip performs normal data transfer by using the arrangement for performing normal data transfer, and the chip identifier of its own chip. Note that the arrangement for performing normal data transfer includes the normal transfer request transmission unit 106, normal transfer response reception unit 107, normal transfer request reception unit 108, and normal transfer response transmission unit 109. Note also that normal data transfer is performed through the request bus 501 and response bus 502.

Note that DEMUX 111 of the semiconductor chip 100 detects a pseudo read response even after the setting of the chip identifier of its own chip is completed, because the interposer substrate 500 in the lower layer keeps inputting a fixed value. After the setting of the chip identifier of its own chip is completed, the DEMUX 111 transfers all requests to the normal transfer response reception unit 107. When receiving a read response to a read request not issued by its own chip to the lower layer, the normal transfer response reception unit 107 discards the read response without processing it. Accordingly, no pseudo read response is processed.

FIG. 2 shows an example in which the interposer substrate 500 is arranged below the semiconductor chip 100 in the lowermost layer (on the most downstream side), and inputs the power supply voltage Vcc as a fixed value to the DEMUX 111 of the semiconductor chip 100. However, the present invention is not limited to this, and it is also possible to fix the input value by a pull-up resistance or pull-down resistance.

Also, an example in which the semiconductor chip transmits the identifier confirmation request to the lower layer has been explained above. However, the identifier confirmation request may also be transmitted to the upper layer. In this case, the internal arrangement of the semiconductor chip shown in FIG. 2 is vertically inverted. The response bus 502 input from the upper layer of the semiconductor chip 400 in the uppermost layer (on the most upstream side) is fixed by a pull-up resistance and pull-down resistance, so that the signal value always indicates a value indicating the completion of the setting state of the chip identifier from the upper layer, and indicates the value of the chip identifier.

In other words, the semiconductor chip need only transmit an identifier confirmation request to one of the upstream and downstream, receive an identifier confirmation response from the same one of the upstream and downstream, receive an identifier confirmation request from the other of the upstream and downstream, and transmit an identifier confirmation response to the other.

Timing Chart

Figure 3:
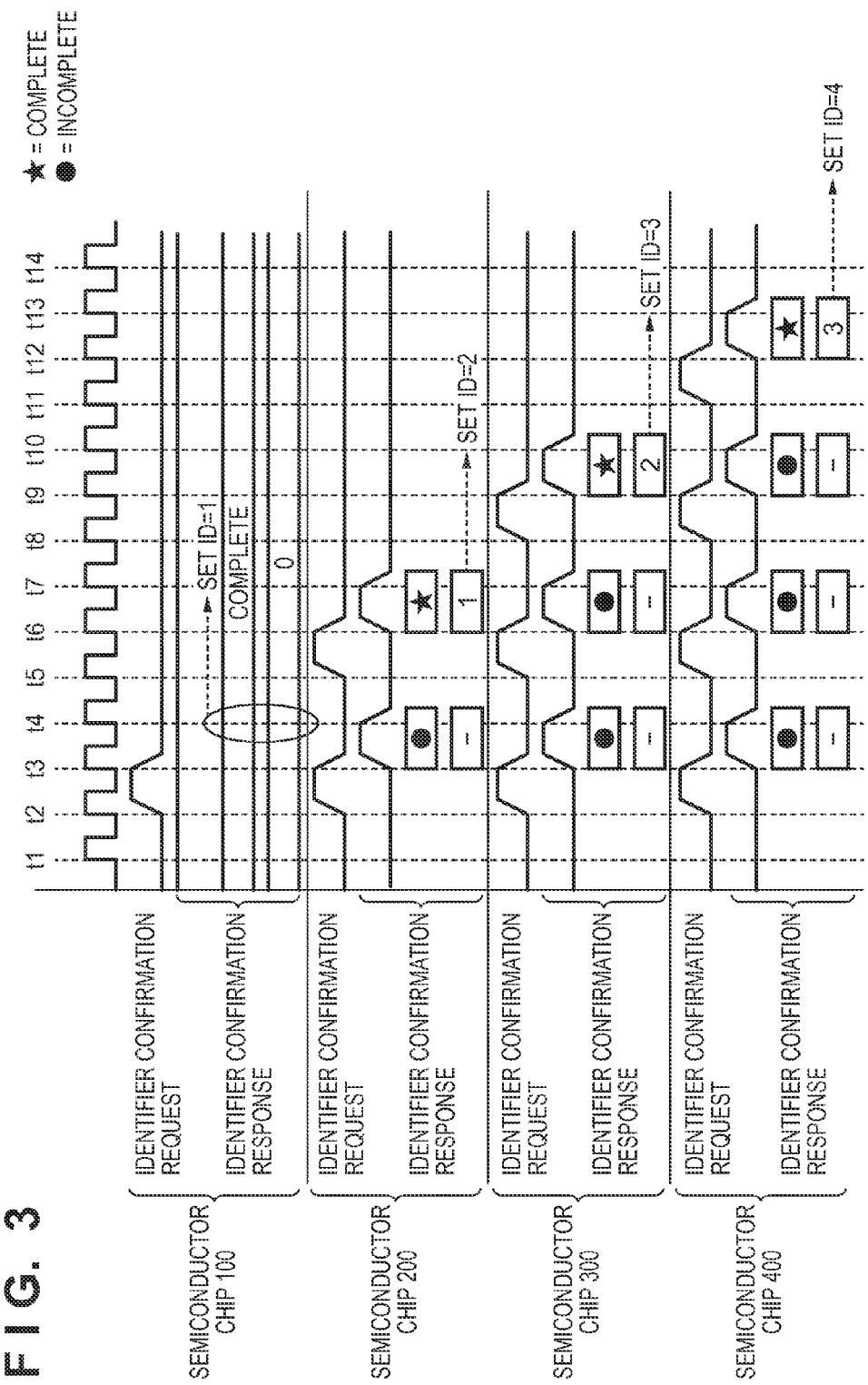
FIG. 3 is a view showing a timing chart of identifier confirmation requests and identifier confirmation responses.

FIG. 3 shows a timing chart of identifier confirmation requests and identifier confirmation responses. After reset is canceled, all the semiconductor chips transmit identifier confirmation requests to their respective lower layers. In this example shown in FIG. 3, the identifier confirmation requests are transmitted at time t2.

After the identifier confirmation requests are transmitted, the semiconductor chip 100 receives an identifier confirmation response at time t4. As described previously, the semiconductor chip 100 always receives a predetermined value, for example, "0" as a chip identifier from the response bus 502. The semiconductor chip 100 sets and holds a value obtained by incrementing the chip identifier in the chip identifier of its own chip. At time t4, therefore, chip identifier "1" is set in the semiconductor chip 100.

At time t2, the semiconductor chip 200 transmits the identifier confirmation request to the semiconductor chip 100. However, the setting of the chip identifier of the semiconductor chip 100 is incomplete, so the semiconductor chip 200 receives an identifier confirmation response indicating the setting incompletion of the chip identifier at time t3.

At time t5, the semiconductor chip 200 retransmits the identifier confirmation request to the semiconductor chip 100. The semiconductor chip 100 having received the identifier confirmation request confirms that the setting of the chip identifier of its own chip is complete. At time t6, the semiconductor chip 100 returns an identifier confirmation response indicating the setting completion of the chip identifier and chip identifier "1" of its own chip, to the semiconductor chip 200.

The semiconductor chip 200 receives the identifier confirmation response at time t6, confirms the setting completion of the chip identifier of the semiconductor chip 100, and sets the setting of the chip identifier of its own chip to "complete". Then, the semiconductor chip 200 increments chip identifier "1" indicated by the identifier confirmation response, thereby setting chip identifier "2".

Similarly, each of the semiconductor chips 300 and 400 retransmits the identifier confirmation request until an identifier confirmation response indicating the setting completion of the chip identifier is received from the semiconductor chip in the lower layer. In this manner, the chip identifiers are set in order from the semiconductor chip in the lower layer.

Figure 4:
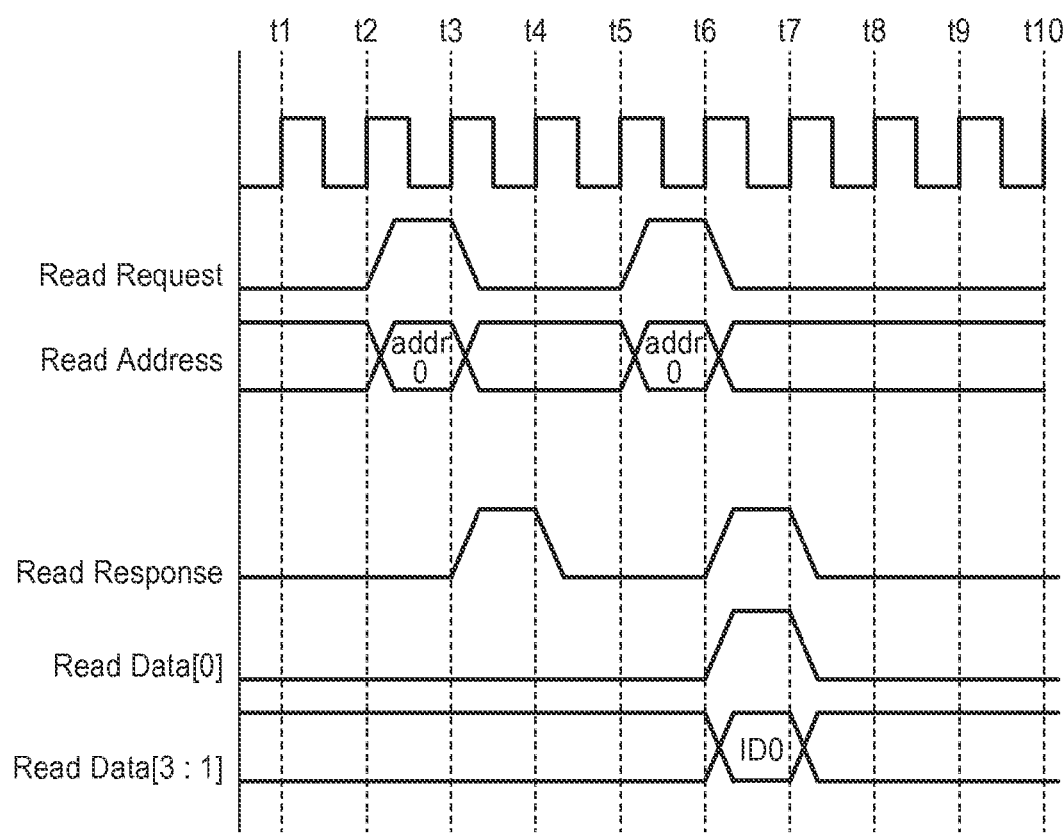
FIG. 4 is a view for explaining the relationship between signals, an identifier confirmation request, and an identifier confirmation response to be used in read access.

The relationship between signals to be used in read access, an identifier confirmation request, and an identifier confirmation response will be explained with reference to FIG. 4.

Signal Read Request indicates the issue of a request, signal Read Address indicates the address of the read request, and signal Read Response indicates the issue of a read response. Also, signal Read Data[0] is the 0th bit of read data, and indicates the setting state of a chip identifier. That is, setting completion is notified when signal Read Data[0] is asserted. Signal Read Data[3:1] is the first to third bits of the read data, and indicates the value of the chip identifier.

At time t2, a semiconductor chip issues a read request indicating predetermined address addr0 to the lower layer. A semiconductor chip in the lower layer receives this read request, and returns a response at time t3 after one cycle if it is possible to perform processing from the reception of an identifier confirmation request to the transmission of an identifier confirmation response in one cycle. At time t3, the setting of the chip identifier of the semiconductor chip in the lower layer is "incomplete". Accordingly, signal Read Response is asserted, and an identifier confirmation response is transmitted to the semiconductor chip in the upper layer. However, signal Read Data[0] is not asserted and indicates the setting incompletion of the chip identifier.

At time t5, the semiconductor chip in the upper layer retransmits the read request as an identifier confirmation request. At time t6, the setting of the chip identifier of the semiconductor chip in the lower layer is "complete". Therefore, signals Read Response and Read Data[0] are asserted, and Read Data[3:1] indicating chip identifier ID0 is transmitted to the semiconductor chip in the upper layer. Thus, the identifier confirmation request and identifier confirmation response are possible by the signals to be used in read access of normal data transfer.

Identifier Setting Unit

Figure 5:
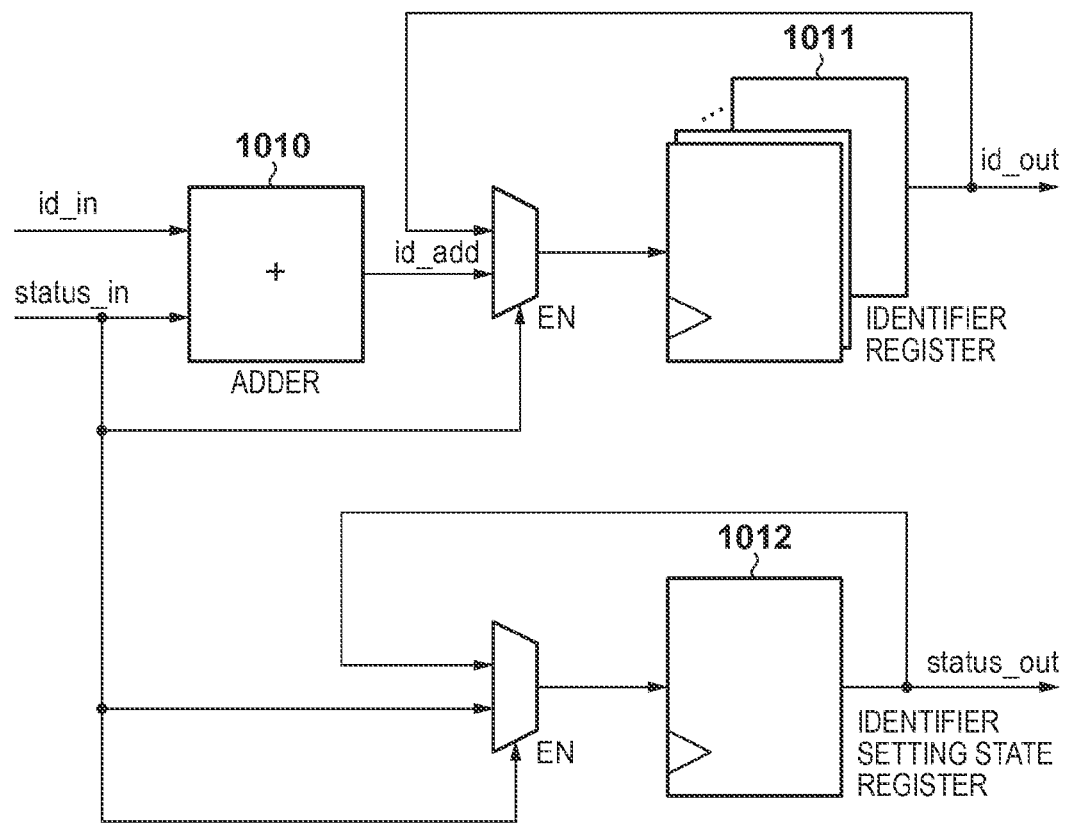
FIG. 5 is a block diagram showing the arrangement of an identifier setting unit.

FIG. 5 is a block diagram showing the arrangement of the identifier setting unit 101.

The identifier setting unit 101 includes an adder 1010, identifier register 1011, and identifier setting state register 1012. The initial value of the identifier setting state register 1012 is '0' indicating setting incompletion.

Signals id_in and status_in are input from the confirmation response reception unit 103 to the identifier setting unit 101. Signal id_in indicates the chip identifier of a semiconductor chip in the lower layer, and signal status_in indicates the setting state of the chip identifier of the semiconductor chip in the lower layer. That is, the confirmation response reception unit 103 transmits, to the identifier setting unit 101, the setting state of the chip identifier of the identifier confirmation response received from the semiconductor chip in the lower layer as signal status_in, and the chip identifier as signal id_in.

When signal status_in is asserted, the adder 1010 outputs signal id_add by adding 1 to signal id_in. The identifier register 1011 is an enable register, latches signal id_add at the timing at which signal status_in is asserted, and holds the value as signal id_out after that.

The identifier setting state register 1012 is also an enable register, and holds '1' at the timing at which signal status_in is asserted. When the identifier setting state register 1012 holds '1' as signal status_out, this indicates the setting completion of the chip identifier.

Identifier confirmation request, identifier confirmation response, and normal data transfer are performed by using signal id_out held by the identifier register 1011, and signal status_out held by the identifier setting state register 1012.

Figure 6:
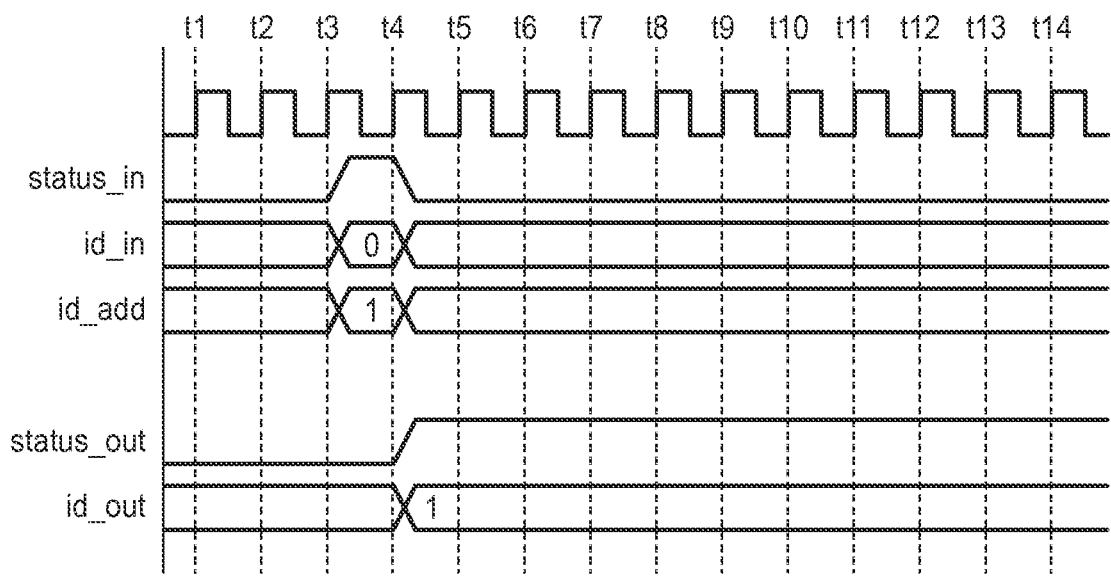
FIG. 6 is a view showing a timing chart of the identifier setting unit.

FIG. 6 shows a timing chart of the identifier setting unit 101.

At time t3, signal status_in is asserted, and "0" is input as signal id_in. The adder 1010 outputs id_add=1 by adding 1 to signal id_in. At time t4, output signal status_out from the identifier setting state register 1012 is asserted, and output signal id_out from the identifier register 1011 becomes "1".

After the chip identifiers are set in all the stacked semiconductor chips, normal data transfer can be performed by using the request bus 501 and response bus 502. FIG. 2 shows only the path for transmitting a request from a semiconductor chip in the upper layer to a semiconductor chip in the lower layer, as a normal data transfer path. In practice, however, there is a path for transmitting a normal data transfer request from a semiconductor chip in the lower layer to a semiconductor chip in the upper layer, so normal data transfer can be performed in two ways.

In normal data transfer, the chip identifier of a semiconductor chip as a data transfer destination must be designated. Chip identifier "1" is set in a semiconductor chip in the lowermost layer, and values to each of which 1 is added are set as chip identifiers toward upper layers. For example, the semiconductor chip 200 recognizes that its own chip is positioned next to the lowermost layer from chip identifier "2" of its own chip, recognizes that there is one semiconductor chip in the lower layer, and, if the stacking of four semiconductor chips is prestored, recognizes that there are two semiconductor chips in the upper layers. When performing normal data transfer to the semiconductor chip 400 higher by two layers, therefore, the semiconductor chip 200 need only designate a value obtained by adding "2" as the number of layers to its own chip identifier, as the chip identifier of the transmission destination.

In the above description, a semiconductor device in which semiconductor chips are stacked has been explained. However, the present invention is also applicable to an arrangement in which a plurality of semiconductor chips are juxtaposed on a silicon interposer substrate and connected to each other with the silicon interposer substrate intervening between them. In this arrangement, a direction in which a request signal as an identifier confirmation request flows is the downstream direction (equal to the lower-layer direction), and a direction in which a response signal as an identifier confirmation response flows is the upstream direction (equal to the upper-layer direction).

As described above, in a semiconductor device in which a plurality of semiconductor chips are stacked, a unique chip identifier can be allocated to each semiconductor chip after reset is canceled. Accordingly, it is unnecessary to allocate chip identifiers to the semiconductor chips in the semiconductor chip manufacturing process, and it is unnecessary to perform sorting by using the chip identifiers when stacking the semiconductor chips. Consequently, a semiconductor device in which a plurality of semiconductor chips are stacked can be implemented with a low cost.

Also, no special signal line is necessary to set a chip identifier, that is, a chip identifier can be set by using only a signal line for normal data transfer. In addition, no special semiconductor chip is necessary to allocate a chip identifier, so a semiconductor device can be formed by using identical semiconductor chips.

This application claims the benefit of Japanese Patent Application No. 2013-126128 filed Jun. 14, 2013 which is hereby incorporated by reference herein in its entirety.

What is claimed is:

1. A semiconductor device comprising a plurality of semiconductor chips, a particular semiconductor chip, amongst the plurality of semiconductor chips, comprising:
   a first transmission unit configured to transmit a first request signal which requests notification of a setting state of a chip identifier, to a first semiconductor chip connected on one of an upstream and a downstream;
   a first reception unit configured to receive a first response signal indicating the setting state and a value of the chip identifier in the first semiconductor chip, as a response to the first request signal;
   a setting unit configured to perform a chip identifier setting process to set a chip identifier to the particular semiconductor chip whose chip identifier setting process is not completed, based on the first response signal;
   a second reception unit configured to receive a second request signal from a second semiconductor chip connected to another of the upstream and the downstream; and
   a second transmission unit configured to transmit a second response signal indicating a setting state and the value of the chip identifier in the particular semiconductor chip, as a response to the second request signal,
   wherein in a case where the first response signal indicates setting incompletion of the chip identifier, the setting unit causes the first transmission unit to retransmit the first request signal.

2. The device according to claim 1, wherein in a case where the first response signal indicates setting completion of a chip identifier, the setting unit performs the chip identifier setting process based on the value of the chip identifier indicated by the first response signal.

3. The device according to claim 2, wherein the setting unit sets, as the chip identifier of the particular semiconductor chip, a value obtained by incrementing the value of the chip identifier indicated by the response signal.

4. The device according to claim 1, further comprising a first signal line configured to perform a normal data transfer request between the plurality of semiconductor chips.

5. The device according to claim 4, wherein the first transmission unit and the second reception unit exchange the first request signal through the first signal line.

6. The device according to claim 4, further comprising a second signal line configured to perform a normal data transfer response between the plurality of semiconductor chips.

7. The device according to claim 6, wherein the first reception unit and the second transmission unit exchange the first response signal through the second signal line.

8. The device according to claim 1, wherein a fixed value is input as the first response signal to the first reception unit of a semiconductor chip on a most downstream side or a most upstream side of the plurality of chip identifiers.

9. The device according to claim 8, wherein the fixed value indicates setting completion of the chip identifier and a predetermined value as the chip identifier.

10. The device according to claim 1, wherein the plurality of semiconductor chips are mounted on an interposer.

11. The device according to claim 10, wherein the plurality of semiconductor chips are stacked on the interposer.

12. The device according to claim 11, wherein the plurality of semiconductor chips are electrically connected with a through via intervening therebetween.

13. The device according to claim 10, wherein the plurality of semiconductor chips are juxtaposed on the interposer.

14. A method of setting chip identifiers of a plurality of semiconductor chips comprised in a semiconductor device, the method comprising:
   at a particular semiconductor chip:

transmitting a first request signal which requests notification of a setting state of a chip identifier, to a first semiconductor chip connected on one of an upstream and a downstream;

receiving a first response signal indicating the setting state and a value of the chip identifier in the first semiconductor chip, as a response to the first request signal;

in a case where the received first response signal indicates setting incompletion of the chip identifier, retransmitting the first request signal;

performing a chip identifier setting process to set a chip identifier to the particular semiconductor chip whose chip identifier setting process is not completed, based on the first response signal;

receiving a second request signal from a second semiconductor chip connected to another of the upstream and the downstream; and transmitting a second response signal indicating a setting state and a value of the chip identifier in the particular semiconductor chip, as a response to the second request signal.

15. A semiconductor device comprising a plurality of semiconductor chips, each semiconductor chip comprising:

a first transmission unit configured to transmit a first request signal which requests notification of a setting state of a first chip identifier, to a first semiconductor chip connected on one of an upstream and a downstream;

a first reception unit configured to receive a first response signal indicating the setting state of the first chip identifier and a value of the first chip identifier, as a response to the first request signal;

a setting unit configured to perform a chip identifier setting process based on the first response signal;

a second reception unit configured to receive a second request signal from a second semiconductor chip connected to another of the upstream and the downstream; and a second transmission unit configured to transmit a second response signal indicating a setting state of a second chip identifier and a value of the second chip identifier, as a response to the second request signal, wherein in a case where the first response signal indicates setting incompletion of the first chip identifier, the setting unit causes the first transmission unit to retransmit the first request signal.

16. A method of setting chip identifiers of a plurality of semiconductor chips comprised in a semiconductor device, the method comprising:

transmitting a first request signal which requests notification of a setting state of a first chip identifier, to a first semiconductor chip connected on one of an upstream and a downstream;

receiving a first response signal indicating the setting state of the first chip identifier and a value of the first chip identifier, as a response to the first request signal;

in a case where the first response signal indicates setting incompletion of the first chip identifier, retransmitting the first request signal;

performing a chip identifier setting process based on the first response signal;

receiving a second request signal from a second semiconductor chip connected to another of the upstream and the downstream; and transmitting a second response signal indicating a setting state of a second chip identifier and a value of the second chip identifier, as a response to the second request signal.

* * * * *